United States Patent
Zheng

[19]

[11] Patent Number: 5,986,945
[45] Date of Patent: Nov. 16, 1999

[54] MEMORY DEVICE OUTPUT CIRCUIT HAVING MULTIPLE OPERATING MODES

[75] Inventor: Hua Zheng, Fremont, Calif.

[73] Assignee: Winbond Electronics Corporation, Taiwan

[21] Appl. No.: 09/294,852

[22] Filed: Apr. 20, 1999

[51] Int. Cl.$^6$ ...................................................... G11C 7/04
[52] U.S. Cl. .................... 365/189.05; 365/233; 365/226; 365/230.03
[58] Field of Search .............................. 365/189.05, 233, 365/226, 230.03

[56] References Cited

U.S. PATENT DOCUMENTS

| | | | |
|---|---|---|---|
| 5,703,811 | 12/1997 | Yoo et al. | 365/189.05 |
| 5,786,711 | 7/1998 | Choi | 326/83 |
| 5,798,969 | 8/1998 | Yoo et al. | 365/189.05 |

Primary Examiner—Andrew Q. Tran
Attorney, Agent, or Firm—Townsend and Townsend and Crew LLP

[57] ABSTRACT

A memory device that includes decoding circuitry, a memory array, conditioning circuitry, and an output circuit. The decoding circuitry is configured to receive address information and generate a set of control signals. The memory array couples to the decoding circuitry and is configured to provide a data value in response to the set of control signals. The conditioning circuitry couples to the memory array and is configured to receive and condition the data value to provide a data bit. The output circuit couples to the conditioning circuitry and is configured to receive the data bit and provide an output bit. The output circuit is further configured to operate in one of a number of operating modes, with each operating mode corresponding to a different timing scheme. The output circuit can be implemented using a pair of latches coupled in series. The different operating modes can be achieved, for example, by selectively placing one of the latches in a bypass mode. A timing circuit can be used to provide the necessary clock signal(s) for the output circuit.

20 Claims, 5 Drawing Sheets

MEMORY DEVICE OUTPUT CIRCUIT HAVING MULTIPLE OPERATING MODES

BACKGROUND OF THE INVENTION

The present invention relates generally to integrated circuits, and more particularly to an output circuit having multiple operating modes for use in memory devices and other integrated circuits.

Memory devices are integral to a computer system and to many electronic circuits. Continuous improvements in the operating speed and computing power of a central processing unit (CPU) enable operation of an ever-greater variety of applications, many of which require faster and larger memories. Larger memories can be obtained by shrinking the geometry of the memory cells and the data/control lines within the memory devices. Faster operating speed can be obtained by reducing the charge and discharge times of parasitic capacitance on internal data lines and by improving the data-clocking scheme within the memory devices.

Conventionally, a memory access to retrieve a data bit is performed by: (1) activating a row control line (e.g., a row select line or a word line) for the data bit; (2) waiting for the charge that is stored in a memory cell corresponding to the data bit to generate a voltage on a sense line; (3) sensing the charged voltage on the sense line to determine the value of the data bit; (4) activating a column select line; (5) providing the detected bit value to a data line, and (6) buffering and providing the data bit to an input/output (I/O) pin of the memory device. Conventionally, these steps are performed in sequential order for each accessed data bit. These steps define the access time of the memory device (i.e., to read a data bit), which in turn determines the data transfer rate.

The data bit retrieved from the memory cell is typically provided to an output circuit, which often includes a data synchronization circuit and an output driver circuit. The data synchronization circuit is conventionally implemented with either a latch or a register. Each of these implementations is advantageous for some situations (i.e., certain timing scenarios and operating conditions), and may not be advantageous for other situations. For example, the timing of the data and clock signal provided to the data synchronization circuit can vary with power supply and temperature. For a particular implementation (i.e., latch or register output circuit), variations in the timing relationship between the data and clock can degrade timing margins and can even impact product yields. To account for timing variations, the period of the clock signal can be "lengthened", which however corresponds to slower operating speed.

As can be seen, an output circuit capable of operating under different timing relationships and operating conditions is highly desirable.

SUMMARY OF THE INVENTION

The invention provides an output circuit for memory devices and other integrated circuits having improved performance over conventional output circuits. In particular, the output circuit of the invention is capable of operating in one of a number of operating modes, with each operating mode corresponding to a different timing scheme. In an embodiment, the operating mode is selected based on the timing relationship between the data bit and the clock signal provided to the output circuit. As this timing relationship changes (i.e., due to changes in operating conditions or other factors), the output circuit of the invention can be selectively and dynamically configured to operate in the operating mode that provides a number of benefits such as improved timing margins, faster output response, faster operating speed, and others.

An embodiment of the invention provides a memory unit that includes a decoding circuitry, a memory array, a conditioning circuitry, and an output circuit. The decoding circuitry is configured to receive address information and generate a set of control signals. The memory array couples to the decoding circuitry and is configured to provide a data value in response to the set of control signals. The conditioning circuitry couples to the memory array and is configured to receive and condition the data value to provide a data bit. The output circuit couples to the conditioning circuitry and is configured to receive the data bit and provide an output bit. The output circuit is further configured to operate in one of a number of operating modes, with each operating mode corresponding to a different timing scheme. The output circuit can be implemented using a pair of latches coupled in series. The different operating modes can be achieved, for example, by selectively placing one of the latches in a bypass mode. A timing circuit provides the necessary clock signal(s) for the output circuit.

Another embodiment of the invention provides a memory device that includes a row decoder, a column decoder, a memory array, a sense amplifier, an output circuit, and a timing circuit. The row decoder is configured to receive address information and generate a first set of control signals (i.e., the word lines). The column decoder is configured to receive address information and generate a second set of control signals (i.e., the column select lines). The memory array couples to the row and column decoders and is configured to provide a data value in response to the first and second sets of control signals. The sense amplifier couples to the memory array and is configured to receive and condition the data value and provide a data bit. The output circuit couples to the sense amplifier and is configured to receive the data bit and provide an output bit. The output circuit is further configured to operate in either a latch mode or a register mode. The timing circuit couples to the output circuit and is configured to provide a set of clock signals for the output circuit.

Yet another embodiment of the invention provides a memory device that includes a row decoder, a column decoder, a number of memory arrays, a set of sense amplifiers, a set of output circuits, and a timing circuit. The row and column decoders are each configured to receive address information and generate a respective set of control signals (i.e., word lines or column select lines). The memory arrays couple to the row and column decoders, with each memory array being configured to provide a data value on a data line when commanded by the sets of control signals. Each of the sense amplifiers operatively couples to a respective data line and is configured to condition the data value on the data line and provide a data bit. Each of the output circuits operatively couples to one sense amplifier and is configured to receive the data bit and provide an output bit. The output circuits are further configured to operate in either a latch mode or a register mode. The timing circuit couples to the output circuits and is configured to provide a set of clock signals for the output circuits.

The foregoing, together with other aspects of this invention, will become more apparent when referring to the following specification, claims, and accompanying drawings.

DESCRIPTION OF THE SPECIFIC EMBODIMENTS

For clarity, the invention is described for a specific implementation of an output circuit. However, the specific details are intended to be illustrative, and not limitations, of the present invention. It will be recognized that alternative implementations of the invention and modifications of the circuits described herein can be made (i.e., to satisfy a particular design requirement), and these variations are all within the scope of the invention.

Figure 1:
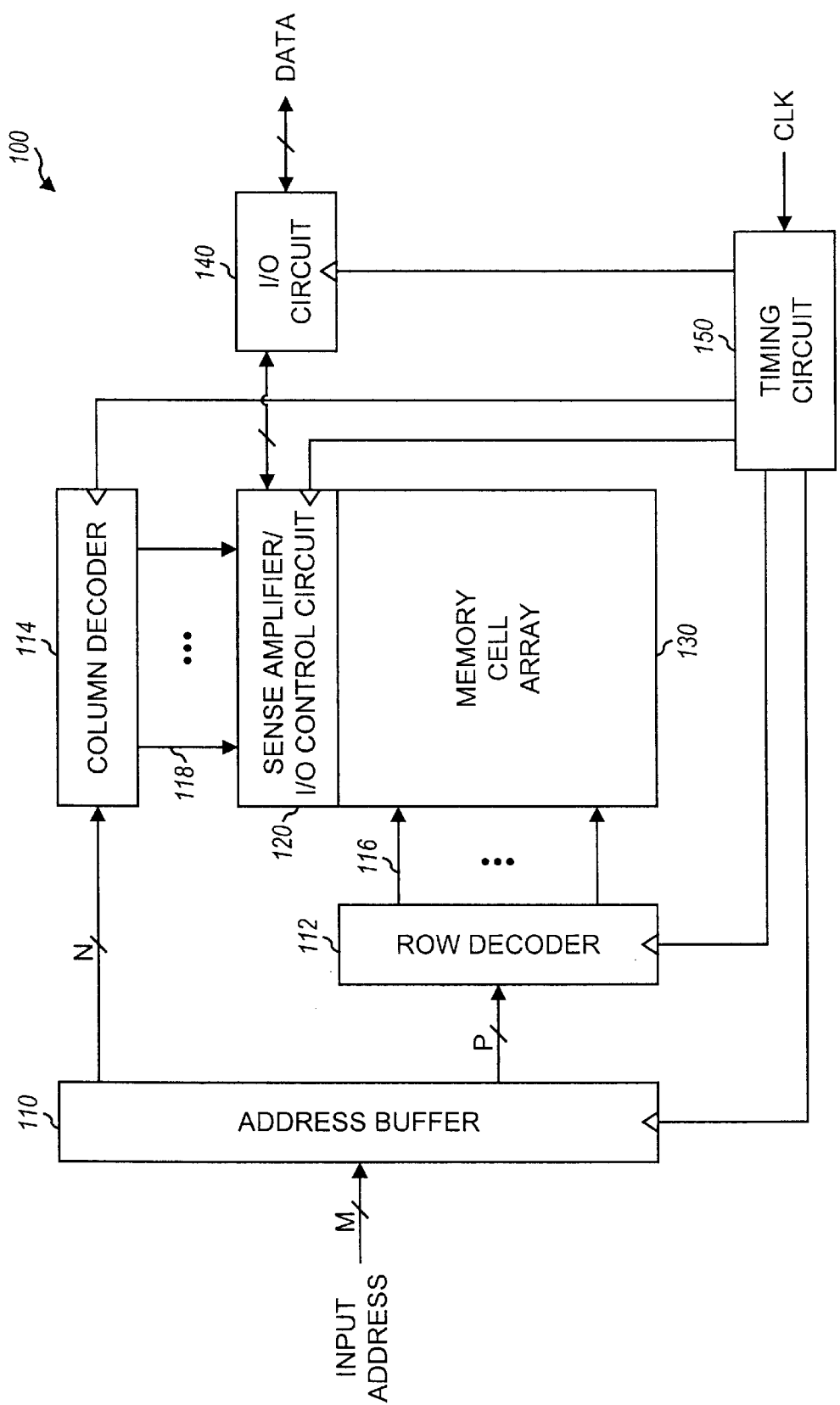
FIG. 1 shows a simplified diagram of an embodiment of a memory device.

FIG. 1 shows a simplified diagram of an embodiment of a memory device 100. As shown in FIG. 1, memory device 100 includes an address buffer 110 for receiving an input address and providing buffered address information to a row decoder 112 and a column decoder 114, Row decoder 112 activates one of a number of row control lines (or word lines) 116 for the selected memory cell(s), as determined by the address information received from buffer 110. In some memory array architectures, row decoder 112 may select a subset (i.e., two or more) of word lines to allow concurrent access to multiple memory cells.

Similarly, column decoder 114 activates one of a number of column select lines (CSLs) 118 for the selected memory cell(s), as determined by the address information received from buffer 110. CSLs 118 couple to a sense amplifier and input/output (I/O) control circuit 120. Circuit 120 further couples to a memory cell array 130 and an I/O circuit 140. Circuit 120 provides the signal conditioning and drive for the signals to and from memory cell array 130. Circuit 120 further provides the control and signal buffering for the signals to and from I/O circuit 140. I/O circuit 140 provides signal buffering and drive for data bits to be provided to the device I/O pads, signal buffering for data bits to be provided to the memory array, and other functions. A timing circuit 150 generates the clocks and control signals for the various circuits within memory device 100.

Memory cell array 130 includes memory cells for many data bits. The memory cells are typically arranged in a two-dimensional array. Word line 116 from row decoder 112 selects a particular row within memory cell array 130, and CSL 118 from column decoder 114 selects a particular column. In a specific embodiment, each memory cell array 130 includes 512 columns and 512 word lines (plus some redundant columns and word lines). Typically, one CSL is provided for one or more bit lines (BL). The selected word line and CSL are activated in accordance with the address provided to address buffer 110 by a source external or internal to the memory device.

For simplicity, FIG. 1 shows only one memory cell array 130. Generally, a memory device includes more than one memory cell array, which may be arranged into a number of memory blocks. Each memory block can include any number of memory cell arrays. As an example, a memory device can be a 64-Mbit DRAM device having four memory array blocks, with each memory array block including sixteen memory cell arrays, whereby each memory well array includes 1 Mbits of memory. As another example, a memory device can be a 256-Mbit DRAM device having eight memory array blocks, with each memory array block including sixteen memory cell arrays, whereby each memory cell array includes 2 Mbits of memory.

Figure 2:
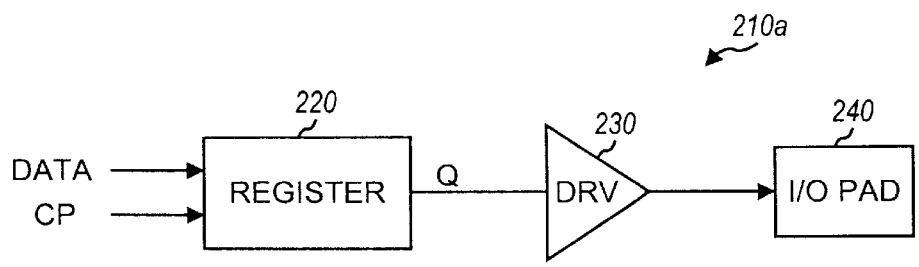
FIG. 2 shows a diagram of an embodiment of an output circuit that includes a register coupled to an output driver.

FIG. 2 shows a diagram of an embodiment of an output circuit 210a within I/O circuit 140 for buffering one output data bit. Output circuit 210a includes a register 220 coupled to an output driver (DRV) 230 that further couples to an I/O pad 240. Register 220 receives the data (DATA) from circuit 120 and the clock signal (CP) from timing circuit 150, clocks the data with the clock signal, and provides the registered data (Q) at the register output. Output driver 230 receives and buffers the registered data and drives I/O pad 240. In an embodiment, register 220 clocks the data on the rising edge of the clock signal (CP).

Figure 3:
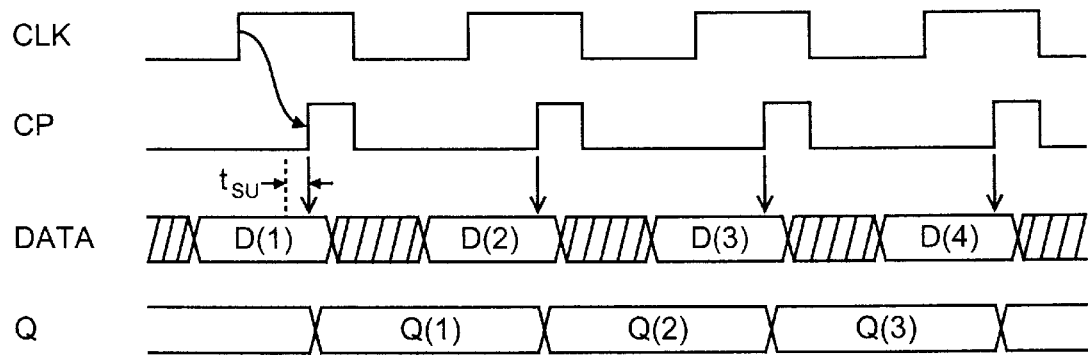
FIG. 3 shows a timing diagram for the output circuit shown in FIG. 2.

FIG. 3 shows a timing diagram for output circuit 210a. The clock signal (CP) is generated within timing circuit 150 based on an external clock signal (CLK). The data is also generated using the external clock signal (CLK) via another circuit that typically operates independently of the circuit that generates the clock signal (CP). For a register, the data is required to be valid and stable for a predetermined set-up time ($t_{su}$) prior to the rising edge of the clock signal (CP). The data is clocked at the rising clock edge, as indicated by the down arrow, and provided as the registered data (Q). In an embodiment, the hold-time is zero and the input data is allowed to change shortly after the rising clock edge. The registered data (Q) is also available shortly after the rising clock edge.

Figure 4:
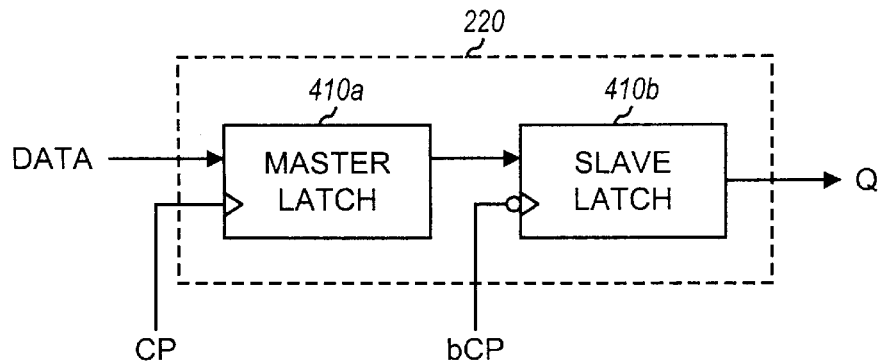
FIG. 4 shows a diagram of an embodiment of a register.

FIG. 4 shows a diagram of an embodiment of register 220. Register 220 includes a master latch 410a coupled in series with a slave latch 410b. Master latch 410a receives the data (DATA) and the clock signal (CP) and provides the latched data to slave latch 410b. Slave latch 410b farther receives the complementary clock signal (bCP) and provides the registered data (Q). The complementary clock signal (bCP) has a different phase (i.e., complementary or inverted) with respect to the phase of the clock signal (CP). The complementary clock signal (bCP) can be generated, for example, by inverting the clock signal (CP) through an inverter or by simply delaying the clock signal (CP).

Figure 5:
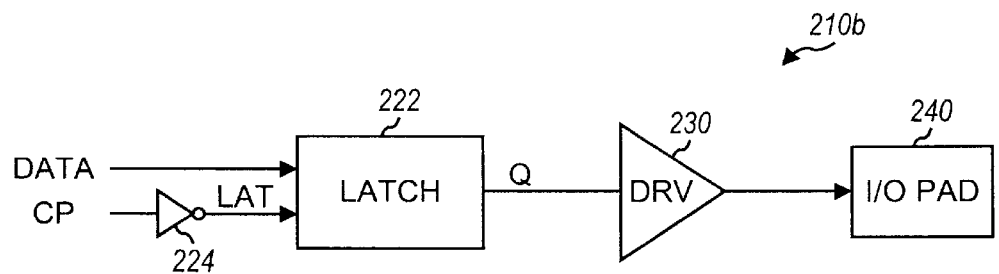
FIG. 5 shows a diagram of an embodiment of an output circuit that includes a latch coupled to an output driver.

FIG. 5 shows a diagram of an embodiment of an output circuit 210b that includes a latch 222 coupled to output driver 230. Similar to register 220, latch 222 receives the data (DATA) from circuit 120 and the clock signal (CP) from timing circuit 150 via an inverter 224. Latch 222 latches the data with the clock signal and provides the latched data (Q) to the latch output. Output driver 230 receives and buffers the latched data and drives I/O pad 240. In an embodiment, the data is latched at the falling edge of the clock signal (CP), which is achieved by buffering the clock signal (CP) with inverter 224.

Figure 6:
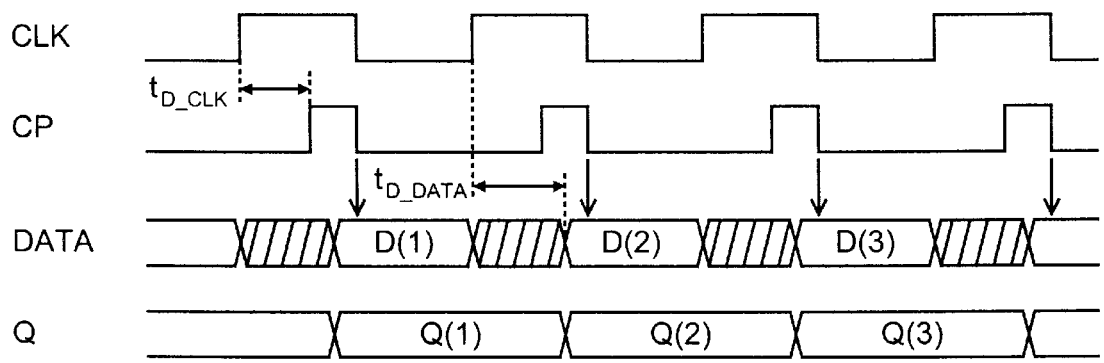
FIG. 6 shows a timing diagram for the output circuit shown in FIG. 5.

FIG. 6 shows a timing diagram for output circuit 210b. The data is valid and stable prior to the falling edge of the clock signal (CP), and is latched at the falling clock edge as indicated by the down arrow. The latched data (Q) is available shortly after the falling clock edge.

Conventionally, the output circuit is designed using either a register type output circuit (i.e., such as the one shown in FIG. 2) or a latch type output circuit (i.e., such as the one shown in FIG. 5). Once the design choice has been made, the output circuit is required operate under all specified (data/clock) timing relationships and operating conditions.

Referring to FIG. 6, the internal clock signal (CP) is generated from the external clock signal (CLK) and is associated with a predetermined time delay ($t_{D\_CLK}$). The data from circuit 120 is derived using another (typically independent) circuit and is associated with another time delay ($t_{D\_DATA}$) relative to the external clock signal (CLK). This data time delay ($t_{D\_DATA}$), and to an extent the clock time delay ($t_{D\_CLK}$), can vary under different operating conditions. For example, the data time delay is typically longer at low supply voltages and/or high temperature, and is typically shorter at high supply voltages and/or low temperature. Thus, relative to the internal clock signal (CP), the data can appear to be asynchronous (or not stationary, time-wise) under different operating conditions.

To account for variations in the timing relationship between the data and clock signal (CP), some conventional designs increase the period of the clock signal to ensure that the data and clock timing requirement is met for all specified operating conditions. However, the longer clock period reduces the operating speed of the memory device.

Figure 7:
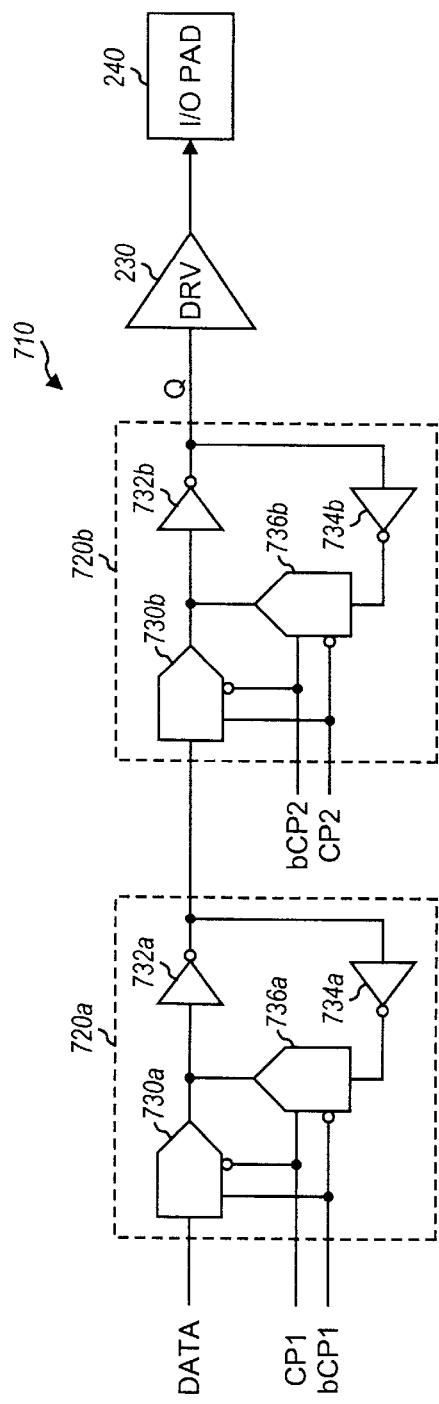
FIG. 7 shows a diagram of a specific embodiment of an output circuit having multiple operating modes.

FIG. 7 shows a diagram of a specific embodiment of an output circuit 710 having multiple operating modes. Output circuit 710 includes a master latch 720a coupled in series with a slave latch 720b. Within each latch 720, a transmission gate 730, inverters 732 and 734, and a transmission gate 736 couple in series. The output of transmission gate 730 couples to the output of transmission gate 736. The input of transmission gate 730 comprises the latch input that receives the input data and the output of inverter 732 comprises the latch output that provides the latched data.

Each transmission gate includes an inverting control input and a non-inverting control input. The inverting control input of transmission gate 730 and the non-inverting control input of transmission gate 736 couple together and to an input clock signal (i.e., CP1 for latch 720a. The non-inverting control input of transmission gate 730 and the inverting control input of transmission gate 736 couple together and to the complementary input clock signal (i.e., bCP1 for latch 720a). With this configuration, either transmission gate 730 or 736 is turned on, depending on the phase of the input clock signal. When the input clock signal is high, transmission gate 730 is turned on and the input data is provided to the latch output. Alternatively, when the input clock signal is low, transmission gate 730 is turned off, transmission gate 736 is turned on, and the latched data is maintained.

Figure 8:
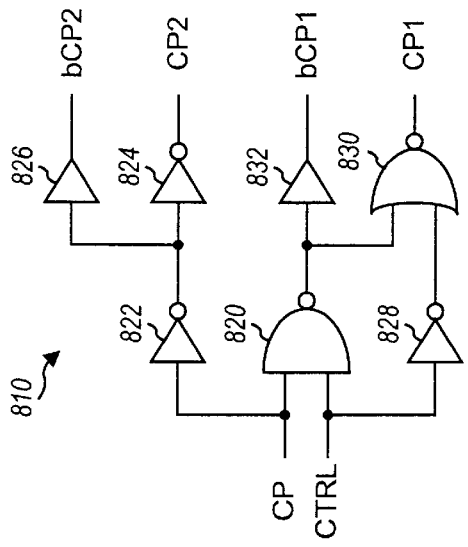
FIG. 8 shows a diagram of a specific embodiment of a timing circuit for generating the clock signals for the output circuit shown in FIG. 7.

FIG. 8 shows a diagram of a specific embodiment of a timing circuit 810 for generating the clock signal; for output circuit 710. Timing circuit 810 can reside within timing circuit 150 in FIG. 1. Timing circuit 810 receives the clock signal (CP) and a control signal (CTRL). The clock signal (CP) is provided to an input of a NAND gate 820 and an inverter 822. Inverter 822 further couples to an inverter 824 and a buffer 826. Inverter 824 and buffer 826 provide the clock signals CP2 and bCP2, respectively. The control signal (CTRL) couples to a second input of NAND gate 820 and to an inverter 828 that further couples to an input of a NOR gate 830. NAND gate 820 further couples to a second input of NOR gate 830 and to a buffer 832. NOR gate 830 and buffer 832 provide the clock signals CP1 and bCP1, respectively.

Timing circuit 310 operates in the following manner. The clock signal (CP) is buffered by inverters 822 and 824 to generate the clock signal (CP2), and is buffered by inverter 822 and buffer 826 to generate the complementary clock signal (bCP2). This complementary clock signal pair is generated at all times and is delayed relative to the clock signal (CP). The clock signal (CP) is also provided to NAND gate 820, which also receives the control signal (CTRL). When the control signal (CTRL) is low, the outputs of NAND gate 820 and buffer 832 are both high, thereby forcing the output of inverter 828 high and the output of NOR gate 820 low. Alternatively, when the control signal (CTRL) is high, the outputs of NAND gate 820 and buffer 832 are the inverted clock signal, the output of inverter 828 is low, and the output of NOR gate 820 is the non-inverted clock signal. Thus, the clock signal (CP1) is inactive (i.e., low) when the control signal is low, and is a delayed version of the clock signal (CP) when the control signal is high.

In an embodiment, the control signal (CTRL) is generated based on the operating mode of the memory device. The operating mode indicates the timing relationship between the read command and the when the data is available from the data buffer. For example, the different operating modes can correspond to different column address select (CAS) latencies (or timing delay), such as those shown in FIGS. 10 and 11. The control signal (CTRL) cart then be set based on the determined operating mode of the device, e.g., CTRL= high for CAS latency 2 (FIG. 10) and CTRL=low for CAS latency 3 (FIG. 11). Typically, the operating mode of the device is known a priori before the device is accessed, and is determined from a value stored in a mode setting register.

Referring back to FIG. 7, master latch 720a receives the first clock signal (i.e., complementary clock signal pair CP1 and bCP1) and slave latch 720b receives the second clock signal (i.e., complementary clock signal pair CP2 and bCP2). By properly controlling these clock signals, output circuit 710 can be selectively operated as either a latch or register. Specifically, by setting the first clock signal high (i.e., CP1=high), master latch 720a is bypassed and output circuit 710 operates like a conventional latch. Alternatively, by activating the first clock signal (CP1) in conjunction with the second clock signal (CP2), master latch 720a and slave latch 720b operate together to form a register.

Output circuit 710 can be dynamically selected to operate as either a latch or a register based on various factors. For example, the latch or register mode can be selected based on the operating mode of the memory device, the operating condition (e.g., supply voltages and temperature), and other factors. Furthermore, the clock signals (CP1 or CP2, or both) can be delayed by different amounts based on, for example, the operating condition of the device.

Figure 9:
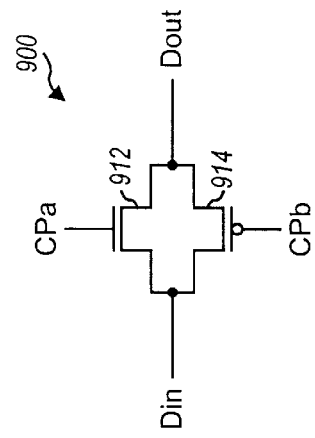
FIG. 9 shows a schematic diagram of a specific embodiment of a transmission gate.

FIG. 9 shows a schematic diagram of a specific embodiment of a transmission gate 900. Transmission gate 900 can be used to implement transmission gates 730 and 736 in FIG. 7. Transmission gate 900 includes a pair of complementary transistors, an N-channel transistor 912 and a P-channel transistor 914, coupled in parallel. The gate of transistor 912 forms the non-inverting control input of transmission gate 900 and the gate of transistor 914 forms the inverting control input. When activated (i.e., by setting the non-inverting control input to logic high and the inverting control input to logic low), transmission gate 900 behaves like a closed switch that allows the input signal to be provided through the transmission gate. Alternatively, when deactivated (i.e., by setting the non-inverting control input to logic low and the inverting control input to logic high), transmission gate 900 behaves like an open switch that isolates the gate output from the gate input.

Figure 10:
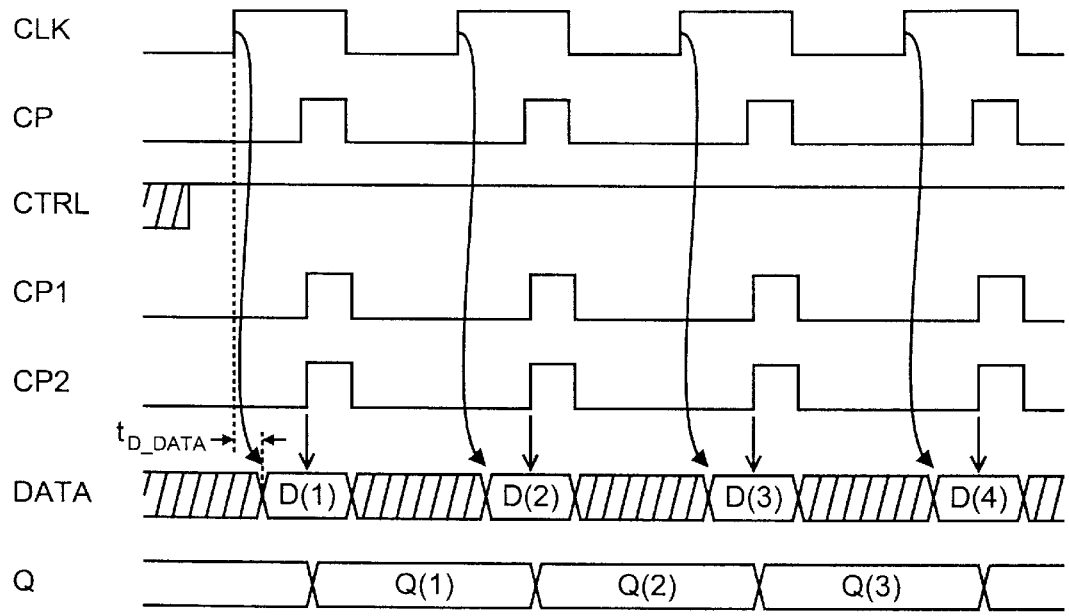
FIGS. 10 and 11 show two timing diagrams for the output circuit shown in FIG. 7 for two different operating modes.
Figure 11:
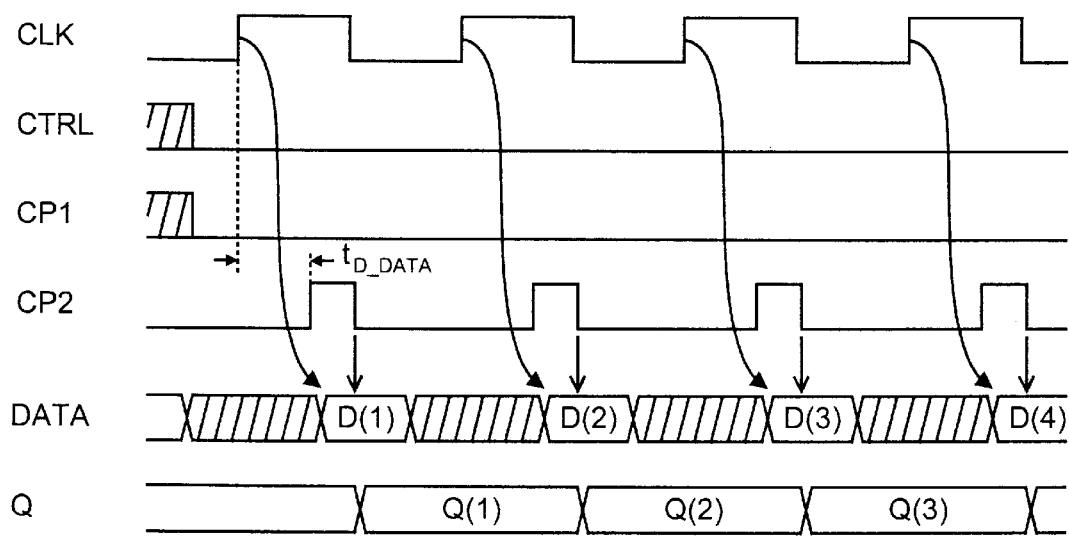

FIGS. 10 and 11 show two timing diagrams for output circuit 710 for two different operating modes. The clock signal (CP) is used to control the output access timing and the output data, and is typically generated based on the external clock signal (CLK). Generally, the clock signal (CP) does not change its timing characteristics relative to that of the external clock signal (CLK). The data (DATA) is also derived using the external clock signal (CLK), but can be delayed by different amounts of time depending on the operating conditions and other factors. For example, as the supply voltage and/or temperature change, the characteristics of the internal transistors also change, and the timing of the data can vary by a large amount relative to the external clock signal (CLK). In the invention, based on the amount of delay experienced by the data, the output circuit can be operated in either the register or latch mode to provide improved timing margins and other benefits.

FIG. 10 shows the timing diagram for the register mode. In an embodiment, the register mode is used when the time delay ($t_{D\_DATA}$) is short (relatively), which may occur, for example, at high supply voltages and/or low temperature. In the register mode, the control signal (CTRL) is set high, both clock signals (CP1 and CP2) are activated, and the data is clocked on the rising edge of the clock signal (CP2). The data is ready and available before the rising edge of the clock signal (CP2), but can typically change after the clock signal has transitioned high.

FIG. 11 shows the timing diagram for the latch mode. In an embodiment, the latch mode is used when the data delay ($t_{D\_DATA}$) is longer (relatively), which may occur at low supply voltages arid/or high temperature. In the latch mode, the control signal (CTRL) is set low, the clock signal (CP1) is deactivated, the clock signal (CP2) is activated, and the data is latched on the falling edge of the clock signal (CP2). The data is ready and available before the falling edge of the clock signal (CP2), but can typically change after the clock signal has transitioned high.

The multi-mode output circuit of the invention provides advantages over conventional output circuits. In particular, the multi-mode output circuit can provide improved timing margins and improved (i.e., faster) operating speed for a memory device by reducing the required duration of the clock period. In conventional designs that use only either a register or a latch in the output circuit, the clock period is sometimes extended to ensure proper data/clock timing relationship for all specified operating conditions. These conventional designs can result in a longer clock period and a correspondingly slower operating speed for the device.

In the invention, the data/clock timing relationship is satisfied by using different clocking schemes for different data delays, without having to resort to a "lengthened" clock period. Thus, the multi-mode output circuit of the invention can allow for a faster clock signal, resulting in a faster memory device. In addition, for a particular clock period, the output circuit of the invention can provide improved timing margins.

The multi-mode output circuit of the invention is also relatively simple to implement and do not require much additional die area. As shown in FIG. 7, the multi-mode output circuit can be implemented in similar manner as a conventional register. Moreover, the clock signals (CP1 and CP2) used to the drive the multi-mode output circuit can be implemented with a simple timing circuit, as shown in FIG. 8.

Although the invention is described for a specific embodiment, alternative implementations of the invention and modifications of the circuits described herein can be made. For example, latches 720a and 720b in FIG. 7 can be implemented using different designs, such as by replacing inverters 732 and 734 with NAND gates or omitting these inverters from the design altogether. Also, the clock signals CP1 and CP2 can be introduced with variable amounts of delay to provide even further improvement in timing margins and additional flexibility. Moreover, latch 720b (instead of latch 720a) can be placed in bypass mode when output circuit 710 is operated as a latch. Thus, the specific implementation details are intended to be illustrative, and not limitations, of the present invention.

The architectures described herein can be implemented within a standalone integrated circuit (IC) such as, for example, a dynamic random access memory (DRAM) IC, a synchronous graphics RAM (SGRAM), and other memory devices. The memory arrays can also be implemented within other ICs, such as a processor, a controller, a digital signal processor, an application specific integrated circuit (ASIC), and others. The memory architectures described herein can be implemented on a memory array that is embedded within an integrated circuit such as, for example, central processing unit (CPU).

The foregoing description of the specific embodiments is provided to enable any person skilled in the art to make or use the invention. Various modifications to these embodiments will be readily apparent to those skilled in the art, and the generic principles defined herein may be applied to other embodiments without the use of the inventive faculty. For example, the output circuit of the invention can be configured to provide more than two operating modes. Thus, the invention is not intended to be limited to the embodiments shown her(in but is to be accorded the widest scope consistent with the principles and novel features disclosed herein, and as defined by the following claims.

What is claimed is:

1. A memory unit comprising:

decoding circuitry configured to receive address information and generate a set of control signals;

a memory array coupled to the decoding circuitry, the memory array configured to provide a data value in response to the set of control signals;

conditioning circuitry coupled to the memory array, the conditioning circuitry configured to receive and condition the data value and to provide a data bit; and an output circuit coupled to the conditioning circuitry, the output circuit configured to receive the data bit and provide an output bit, wherein the output circuit is further configured to operate in one of a plurality of operating modes, and wherein each operating mode corresponds to a different timing scheme.

2. The memory unit of claim 1 wherein the output circuit comprises:

a first latch configured to receive the data bit and provide a first latched data bit; and a second latch coupled to the first latch, the second latch configured to receive the first latched data bit and provide the output bit.

3. The memory unit of claim 2 wherein each of the first and second latches comprises at least one transmission gate, wherein one transmission gate is coupled between a latch input and a latch output.

4. The memory unit of claim 2 wherein either the first or second latch is selectively placed in a bypass mode.

5. The memory unit of claim 1 further comprising:

a timing circuit coupled to the output circuit, the timing circuit configured to provide one or more clock signals to trigger the output circuit.

6. The memory unit of claim 5 wherein the timing circuit is configured to provide two clock signals, wherein one clock signal is selectively deactivated by setting the clock signal to a predetermined logic state.

7. The memory unit of claim 6 wherein the two clock signals are substantially aligned in phase when both are activated.

8. The memory unit of claim 1 wherein the output circuit is configured to operate in either a latch mode or a register mode.

9. The memory unit of claim 8 wherein the output circuit is operated in the latch mode when the data bit is delayed by a first time period relative to a clock signal and operated in the register mode when the data bit is delayed by a second time period relative to the clock signal, wherein the second time period is shorter than the first time period.

10. The memory unit of claim 1 wherein the operating mode of the output circuit is selected based on a timing relationship between the data bit and a clock signal used to trigger the output circuit.

11. The memory unit of claim 1 wherein the operating mode of the output circuit is selected based on operating conditions of the memory unit.

12. The memory unit of claim 11 wherein the operating conditions of the memory unit include supply voltage and a temperature.

13. A dynamic random access memory (DRAM) device comprising the memory unit of claim 1.

14. A synchronous graphics random access memory (SGRAM) comprising the memory unit of claim 1.

15. An integrated circuit having an embedded memory array, wherein the integrated circuit comprises the memory unit of claim 1.

16. A memory device comprising:

a row decoder configured to receive address information and generate a first set of control signals;

a column decoder configured to receive address information and generate a second set of control signals;

a memory array coupled to the row and column decoders, the memory array configured to provide a data value in response to the first and second sets of control signals;

a sense amplifier coupled to the memory array, the sense amplifier configured to receive and condition the data value and provide a data bit;

an output circuit coupled to the sense amplifier, the output circuit configured to receive the data bit and provide an output bit, wherein the output circuit is further configured to operate in either a latch mode or a register mode; and a timing circuit coupled to the output circuit, the timing circuit configured to provide a set of clock signals for the output circuit.

17. The memory device of claim 16 wherein the output circuit comprises:

a first latch configured to receive the data bit and provide a first latched data bit; and a second latch coupled to the first latch, the second latch configured to receive the first latched data bit and provide the output bit.

18. The memory device of claim 17 wherein either the first or second latch is selectively placed in a bypass mode.

19. A memory device comprising:

a row decoder configured to receive address information and generate a first set of control signals;

a column decoder configured to receive address information and generate a second set of control signals;

a plurality of memory arrays coupled to the row and column decoders, each memory array configured to provide a data value on a data line when commanded by the first and second sets of control signals;

a plurality of sense amplifiers, each sense amplifier operatively coupled to a respective data line and configured to condition the data value on the data line and provide a data bit;

a plurality of output circuits, each output circuit operatively coupled to one sense amplifier and configured to receive the data bit and provide an output bit, wherein the output circuits are further configured to operate in either a latch mode or a register mode; and a timing circuit coupled to the output circuits, the timing circuit configured to provide a set of clock signal, for the output circuits.

20. The memory device of claim 19 wherein each output circuit comprises:

a first latch configured to receive the data bit and provide a first latched data bit; and a second latch coupled to the first latch, the second latch configured to receive the first latched data bit and provide the output bit.

* * * * *